United States Patent [19]

Nixon

[11] 4,298,843

[45] Nov. 3, 1981

[54] STABILIZED DC AMPLIFIER

[75] Inventor: John M. Nixon, Mineral Wells, Tex.

[73] Assignee: Edo-Aire Mitchell, Mineral Wells, Tex.

[21] Appl. No.: 48,789

[22] Filed: Jun. 15, 1979

[51] Int. Cl.[3] .......................... H03F 1/02; H03F 1/26

[52] U.S. Cl. .......................................... 330/9; 330/69

[58] Field of Search ...................................... 330/9, 69

[56] References Cited

U.S. PATENT DOCUMENTS

| | | | |
|---|---|---|---|
| 3,518,563 | 6/1970 | Ainsworth | 330/9 |
| 3,694,760 | 9/1972 | Loessi | 330/9 |
| 3,988,689 | 10/1976 | Ochi et al. | 330/9 |

*Primary Examiner*—Alfred E. Smith
*Assistant Examiner*—T. N. Grigsby
*Attorney, Agent, or Firm*—Richards, Harris & Medlock

[57] ABSTRACT

A pressure responsive system includes a piezoresistive transducer (10) mounted in a housing (20) with the temperature of the housing and the transducer maintained by heater (22). Operating characteristics of the transducer (10) are normalized by a normalization circuit (18) that interconnects the output of the transducer to a heater control (24). The heater control (24) generates a control signal to the heater (22). A signal varying with pressure is output from the normalization circuit (18) and applied to a DC stabilized gain stage (26) that is corrected for zero signal error and produces an amplification of the transducer output for application to a function generator (12). The function generator (12) converts an absolute pressure signal from the transducer (10) into a signal varying with pressure altitude for utilization in an autopilot system.

9 Claims, 5 Drawing Figures

STABILIZED DC AMPLIFIER

TECHNICAL FIELD

This invention relates to a stabilized amplifier circuit, and more particularly to a stabilized amplifier circuit including sample and hold means alternately connected into the circuit.

BACKGROUND ART

The pressure responsive system of the present invention utilizes a piezoresistive pressure responsive means that is normalized at a selected pressure level and for a selected temperature. The temperature of the transducer is maintained at the selected temperature by controlling the ambient temperature within the supporting housing for the transducer. A voltage output from the transducer, that varies with pressure, is applied to a gain stage having an output applied to a function generator that provides a signal varying with pressure. Thus, the need for a direct mechanical coupling between the pressure transducer and a signal generator is eliminated, thereby doing away with a complicated linkage or pick-off operating through a seal. Further, the piezoresistive pressure transducer requires only a minimum amount of power to provide a signal varying with pressure change for amplification in the gain stage.

Heretofore, various devices and systems for generating a pressure dependent signal have been provided. However, many of the systems furnishing such signals have been a complicated and expensive construction and accordingly are not suitable for small general utility applications, such as general aviation aircraft. Many such systems are difficult to install, thereby making servicing difficult and sacrificing reliability. On the other hand, prior art systems of a simple construction have not provided a satisfactory method of responding to a change in pressure, e.g., a change in aircraft altitude, to provide an accurate pressure related signal.

One application of the present invention is in aircraft control, such as an altimeter or altitude hold system. Altitude pressure responsive systems of the type to which the present invention relates usually consist of a housing containing pressure responsive means expansible and contractible in accordance with changes in ambient atmosphere, and a signal generator operable thereby. Some provision is made between the pressure responsive means and the generator to seal the latter from the ambient atmosphere affecting the pressure responsive means. One manner of sealing consists in the provision of a metal bellows rockable by the pressure responsive means through a linkage arrangement located at one side of the bellows to transmit such motion to the generator through a second linkage arrangement located on the other side of the bellows. Such a linkage arrangement has been found undesirable because the linkages include an undue number of moving parts which are subject to wear and consequently affect the operation of the system.

Other altitude pressure responsive systems have a chamber for the pressure responsive means which is separated and sealed from a second chamber containing the signal generator and other operating parts. Although this eliminates the need of a mechanical connection, the signal generator must operate through the seal to maintain isolation from the chamber containing the pressure responsive means. Such an alternative is likewise undesirable because of the loose coupling required between parts of the signal generator on opposite sides of the seal. This further increases the power requirements of the device.

In accordance with the present invention there is provided a system for normalizing the operating characteristics of a semiconductor pressure transducer that includes means for setting the zero output voltage of the transducer. The output signal of the transducer is normalized for a selected pressure level. The input impedance of the transducer is normalized for a selected temperature.

Also in accordance with the present invention, the selected temperature of the transducer is stabilized by apparatus that includes a housing for supporting the transducer. A heater is mounted in the housing to maintain the temperature of the transducer at a selected level. A circuit connected to the semiconductor transducer generates a temperature error signal applied to a controller that provides an output that is applied to the heater.

Further in accordance with the present invention, a controller responds to the temperature error signal to generate an output applied to the heater.

Also in accordance with the present invention, a pressure responsive system includes a transducer providing an output to a stabilized DC amplifier circuit that comprises an amplifier having a mixer connected to the input thereof. A switch having a first position connects the mixer to a reference source and the output of the amplifier to a sample and hold in a second position, the switch connects the mixer to an input signal from the transducer and connects the sample and hold to the mixer in addition to disconnecting the sample and hold from the output of the amplifier.

BRIEF DESCRIPTION OF THE DRAWINGS

A more complete understanding of the invention and its advantages will be apparent from the specification and claims and from the accompanying drawings illustrative of the invention.

Referring to the drawings.

DETAILED DESCRIPTION

Figure 1:
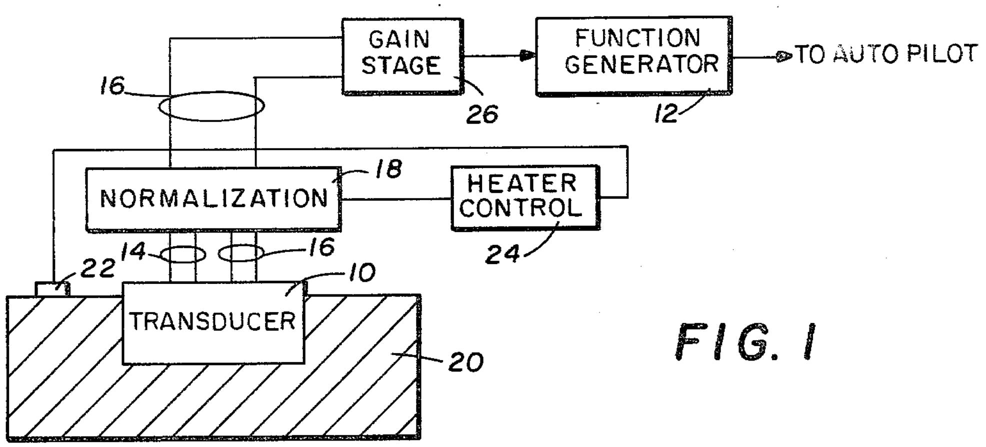
FIG. 1 is a block diagram of a pressure responsive system including a piezoresistive transducer responsive to pressure change.

With reference to FIG. 1, there is shown a block diagram of a pressure responsive system including a semiconductor transducer 10 and a function generator 12 that provides an aircraft altitude control signal varying with ambient pressure at the transducer. The output of the function generator 12 is applied to an aircraft autopilot. As will hereinafter be described, the function generator 12 provides a signal that varies with pressure altitude for control of an aircraft through the autopilot. Where the invention is utilized other than in an aircraft application, the function generator 12 will be configured to generate an output signal varying in some manner with the ambient pressure at the transducer 10.

Typically, the semiconductor transducer 10 is a piezoresistive device having four resistive sections interconnected in a bridge configuration. As such, the transducer includes two input leads 14 and two output leads 16. While the input leads 14 are connected to an energizing source (not shown) these leads also connect to a normalization network 18. The output leads 16 likewise connect to the normalization network 18. By means of the normalization network 18, the transducer 10 is normalized at a selected temperature and selected pressure with the zero output voltage adjusted for the characteristics of the transducer. That is, each transducer 10 has characteristics peculiar to itself and must be individually normalized to produce a repeatable and uniform output for variations in pressure change to which the transducer is subject.

As mentioned, part of the normalization technique is to normalize the transducer 10 for a selected temperature. This temperature is maintained by mounting the transducer 10 in a housing 20 (a heat sink) and maintaining the temperature of the transducer by means of a heater 22. The heater 22 is energized in accordance with the output of a heater control 24 having an input connected to the normalization network 18. The heater control responds to the impedance of the transducer 10, which is a measure of the temperature of the transducer, and generates a current control signal for energizing the heater 22, typically a semiconductor device such as a transistor.

By controlling the heater 22 in response to the impedance of the transducer 10 a measurement is made of the actual temperature of the transducer instead of the conventional technique of measuring temperature of the air surrounding the transducer or the temperature of the housing 20. A measurement of the actual temperature of the transducer 10 is possible because of the substantial temperature coefficient of semiconductor devices. In effect, the transducer 10, because of the temperature coefficient thereof, functions as a thermometer which is measured by the heater control 24 to control the heater 22.

With the output of the transducer 10 normalized for pressure and temperature, a voltage generated on the output lines 16 is applied to input terminals of a gain stage 26 that is a stabilized DC amplifier providing an output signal varying with absolute pressure. This output signal is applied to an input of the function generator 12. The gain stage 26 comprises a DC coupled amplifier which is stabilized for zero shift with temperature. This zero shift is achieved without the conventional chopper stabilized amplification techniques by utilization of storage and hold devices that are periodically coupled to the output of the amplifier. Thus, zero shift stabilization is achieved in the gain stage 26 while at the same time amplifying the low level output of the normalization network 18 to a level sufficient for operation of the function generator 12.

Figure 2:
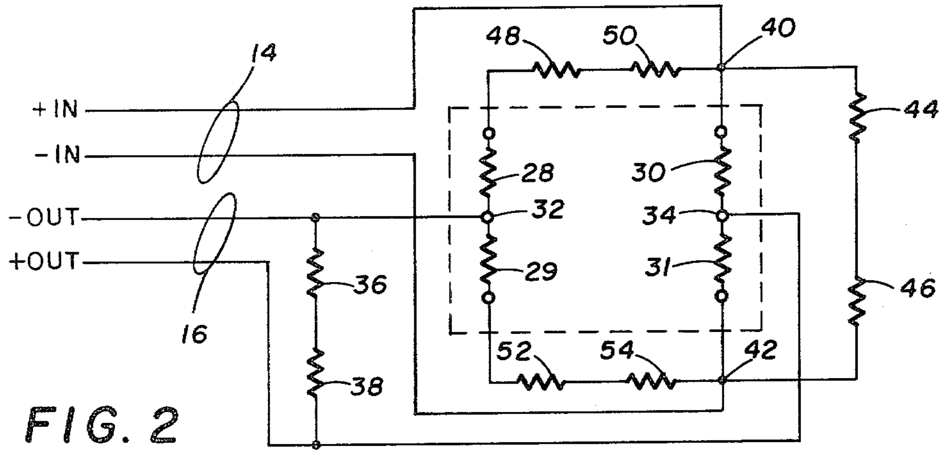
FIG. 2 is a schematic diagram of the piezoresistive transducer and circuitry for normalizing the transducer to a selected pressure and for a selected temperature.

Referring to FIG. 2 there is shown a schematic of the transducer 10 and the normalization network 18 where the transducer consists of strain responsive resistors 28–31 interconnected as four sections of a bridge network. Connected to the output terminals 32 and 34 are the output lines 16 and connected across the output lines is an output gradient normalization resistance network consisting of resistors 36 and 38. Connected to input terminals 40 and 42 are the input lines 14 and connected across the input lines is an input impedance normalization resistance network consisting of resistors 44 and 46. In the section of the bridge including the resistor 28, there is a zero adjusting network consisting of a resistor 48 in series with a resistor 50, the former connected to the resistor 28 and the latter to the input terminal 40. Similarly, in the section of the bridge including the resistor 29, there is connected a zero adjusting network consisting of a resistor 52 in series with a resistor 54, where the former is connected to the resistor 29 and the latter to the input terminal 42. It should be noted that in the normalization of any individual transducer 10 either the resistors 48 and 50 or the resistors 52 and 54 will have a zero value. This is, only one or the other of the zero adjusting networks will be required for any individual transducer.

Depending upon the characteristics of the transducer 10 as provided by the manufacturer, the zero output voltage of the transducer is adjusted by proper selection of resistors 48 and 50 or resistors 52 and 54. With the proper selection of these resistors, the output of the transducer 10 is zeroed for a selected reference point, such as 0 psia.

To normalize the output gradient of the transducer 10, it is subjected to a selected pressure, for example 15 psia, and the resistors 36 and 38 are selected to provide a given level of output voltage change for a given pressure change, for example approximately 135 millivolts for a 15 psi pressure change. Typically, by means of the normalization resistors 36 and 38, the output of the transducer on the lines 16 has a gradient of about 1.27 mv/volt of excitation/psia change per millimeter of mercury.

After output gradient normalization, the transducer 10 is normalized for a selected temperature by varying the input impedance, as measured at the input lines 14 by proper selection of the resistors 44 and 46. These resistors are selected such that the input impedance as measured at the lines 14 has a given value for the selected temperature, for example a temperature of 85 degrees Centigrade. Thus, by means of the resistors 44 and 46, the input impedance to the transducer 10 will be some fixed value for the selected temperature.

With the transducer normalized at a selected temperature, the varying input impedance of the semiconductor devices (resistors 29–31), that is, the substantial temperature coefficient of these elements, can be used as a measure of the temperature of the transducer directly. This variation of the input impedance from the normalized level at the selected temperature is utilized in the heater control 24 to energize the heater 22 and thereby maintain the temperature of the transducer 10.

After normalization of the transducer 10, the output voltage, as appearing on the lines 16, varies accurately and uniformly for pressure changes surrounding the transducer. To maintain this accurate and uniform variation of output voltage, the temperature of the transducer 10 is maintained at the selected level by means of the heater 22.

Figure 4:
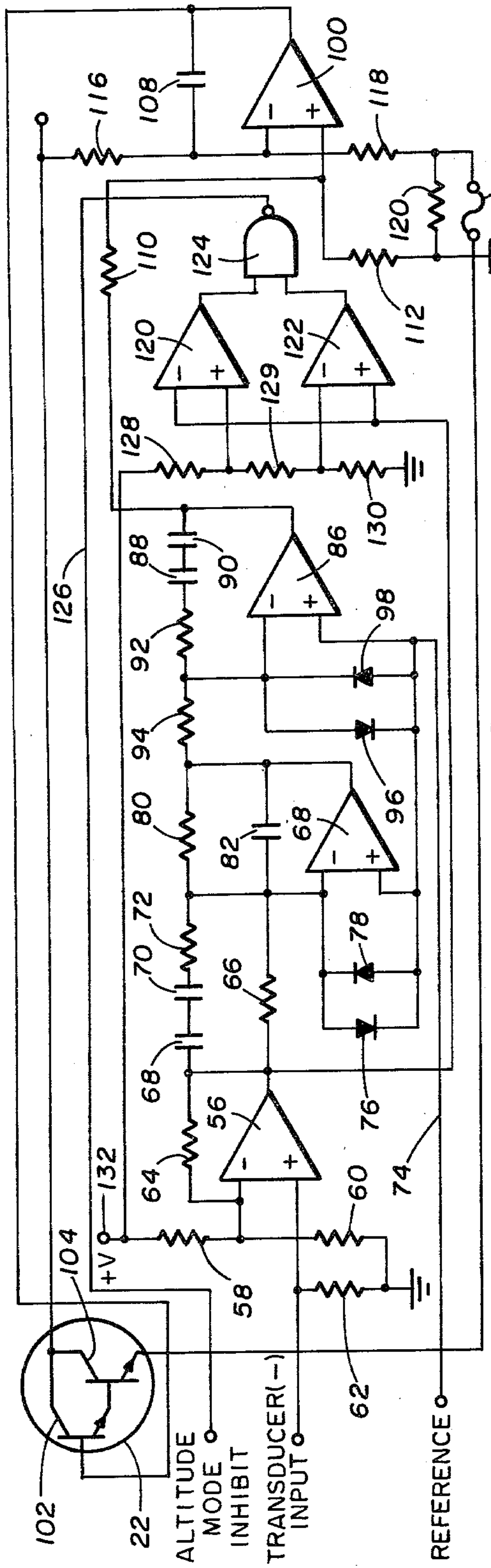
FIG. 4 is a basic schematic diagram of a stabilized DC amplifier circuit.

Referring to FIG. 4, where is shown a schematic for monitoring the impedance, and thereby the temperature, of the transducer 10 and generate a temperature error signal and a derived rate signal, both of which are applied to a current driver for outputting a voltage to energize the heater 22. To monitor the impedance of the transducer 10, the input terminal 42 is connected to an operational amplifier 56 that generates a temperature signal relative to the impedance of the transducer. The input circuit for the amplifier 56 includes resistors 58 and 60 connected as a voltage divider from the positive terminal of a power source to ground. The input signal to the amplifier 56 varies with the impedance of the transducer 10 as generated across an input resistor 62. A feedback network for the amplifier 56 consists of a resistor 64 connected to the amplifier output and to the interconnection of resistors 58 and 60.

Also connected to the output of the amplifier 56 is a resistor 66 that is tied to the input of an amplifier 68. The signal applied from the amplifier 56 is a steady state signal related to the temperature signal. A derived rate signal from the output of amplifier 56 is generated through capacitors 68 and 70 in series with a resistor 72 also connected to an input of the amplifier 68. Connected to the non-inverting input of the amplifier 68 is a reference voltage on a line 74, which for applications of the invention to aircraft control may typically be a pitch reference voltage. Connected across the two inputs of the amplifier 68 is a diode limiter consisting of a diode 76 in parallel with a diode 78. The feedback loop for the amplifier 68 comprises a resistor 80 in parallel with a capacitor 82.

As interconnected, the amplifier 68 provides an output that is the composite of the steady state temperature error signal provided through the resistor 66 and the derived rate signal provided through the capacitors 68 and 70. To provide the necessary gain to achieve stable temperature control of the transducer 10, the output of the amplifier 68 is applied to an integrator consisting of an amplifier 86 having a feedback including capacitors 88 and 90 in series with a resistor 92. The feedback loop provides a very high DC gain and an AC gain of about unity by means of the resistor 92 and an input resistor 94. The input resistor 94 couples the output of the amplifier 68 to an input of the amplifier 86. Connected to the second input of the amplifier 86 is the reference on line 74 and interconnected across the amplifier terminals is a diode limiter consisting of a diode 96 in parallel with a diode 98. By operation of the amplifier 86 as an integrator, the circuit of FIG. 4 will maintain a near zero temperature error signal at the output of the amplifier 56 for accurate temperature control of the transducer 10.

An output of the amplifier 86 is a temperature control signal applied to a voltage controlled current source that includes an amplifier 100 having an output connected to the base electrode of a transistor 102 as part of the heater 22. Included as part of the heater 22, in an emitter follower configuration, is a transistor 104 having an emitter electrode connected to an input of the amplifier 100 through a fuse 106. Also connected to the output of the amplifier 100 is a feedback capacitor 108.

The output of the amplifier 86 is connected to the amplifier 100 through a resistor 110 as part of a voltage divider that consists of a resistor 112 connected to ground. The inverting input terminal of the amplifier 100, in addition to the interconnected collector electrodes of transistors 102 and 104, connects to a power source at terminal 114 through a resistor 116 as part of an input circuit that includes a resistor 118. A current sensing resistor 120 for the heater is interconnected to the resistors 112 and 118.

An output of the amplifier 86, a voltage varying with temperature error of the transducer 10 for a selected temperature, controls the amplifier 100 to provide a constant current to the heater 22 from a near zero error to a maximum error for a given applied source voltage at terminal 114. For variations of the source voltage, the current commanded for any given output of the amplifier 86 will vary to generate a constant power dissipation out of the heater 22. Thus, there is produced a uniform heater gradient because a constant maximum power is applied to the heater 22.

In many applications of the pressure responsive system of the present invention, the output of the function generator 12 must be inhibited until the transducer 10 reaches the selected temperature. This is achieved with the circuit of FIG. 4 by an interconnection of the output of the amplifier 56 to one input of amplifiers 120 and 122. The amplifiers 120 and 122, in operation with a NAND gate 124, comprises a window circuit that monitors the output of the amplifier 56 and generates an inhibit signal on an output line 126. When used in an aircraft control system, the inhibit signal on the output line 126 inhibits the autopilot from being engaged in an altitude mode until the temperature of the transducer 10 reaches the selected level.

Also included as a part of the window circuit is a resistance divider consisting of resistors 128–130 connected in series between the positive terminal of a supply source on terminal 132 and ground. This voltage divider network provides the reference voltages against which the output of amplifier 56 is compared in the amplifiers 120 and 122 to generate the logic control signals to the NAND gate 124. An inhibit signal is generated at the output of a NAND gate 124 until the temperature signal output of the amplifier 56 indicates that the transducer 10 has achieved the selected temperature.

With the transducer 10 normalized by the circuit of FIG. 2 and the temperature stabilized at the selected level by the circuitry of FIG. 4, a signal on the output lines 16 now varies essentially only with pressure change. This signal, which typically is 135 millivolts DC at 15 psia, requires amplification before inputting to the function generator 12. The amplification achieved by the gain stage 26 produces an output voltage that varies at approximatley 10 millivolts DC per millimeter of mercury of applied pressure. To achieve this gain requires a DC amplifier with reasonably good temperature stability in terms of its ability to take a very low level signal from the transducer 10 and amplify it into a high level signal. Most DC amplification suffers from zero inaccuracy which is typically a function of the amplifying element. This is especially true when the amplifying devices are semiconductor materials, such as integrated circuits or transistors having substantial temperature coefficients and producing temperature sensitive voltages. As previously mentioned, conventional techniques for achieving good zero stability in an amplifier that receives a low level DC signal for amplification to a high level DC signal is to use a chopper stabilized amplifier. Chopper stabilization, however, also suffers from zero shift instability when the characteristics of the chopper varies as a function of temperature, and the input signal levels are low, as in the present application.

Figure 3:
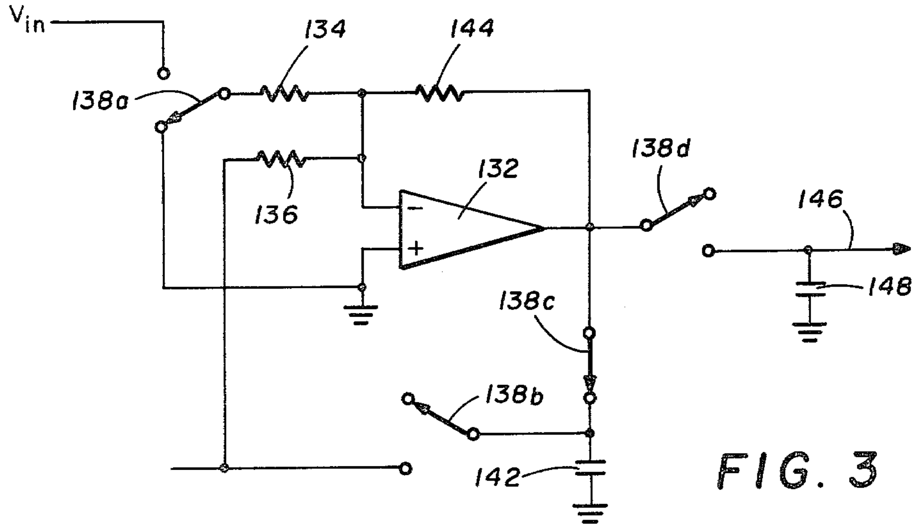
FIG. 3 is a schematic diagram of a transducer heater circuit for maintaining the selected temperature of the piezoresistive transducer.

Referring to FIG. 3, there is shown a basic schematic diagram of a stabilized DC coupled amplifier that receives a low level input signal for amplification to a high level output signal with good zero stability. An operational amplifier 132 has an inverting input terminal connected to a mixing input circuit consisting of resistors 134 and 136. The resistor 134 connects to a switch 138*a* of a plurality of operationally interconnected switches where each switch consists of a single pole, double-throw switch. In one position of the switch 138*a,* the resistor 134 is connected to ground and in the second position of the switch 138*a,* the resistor 134 connects to an input voltage, $V_{in}$. With regard to the resistor 136, it is connected to a switch 138*b* operationally interconnected to the switch 138*a.* The resistor 136 connects to one terminal of the switch 138*b* and the second terminal is opened. The toggle arm of the switch 138*b* connects to a sample and hold capacitor 142.

Also connected to the sample and hold capacitor 142 is one terminal of a switch 138*c* having a second terminal as an open connection. The toggle arm of the switch 138*c* is connected to the output of the amplifier 132. As a feedback for the amplifier 132, a resistor 144 connects between the output and the mixing circuit. Also connected to the output of the amplifier 132 is a switch 138*d* operationally interconnected to the other switches 138. In the first position, the switch 138*d* is open circuited and in the second position, a connection is established to an output line 146. The output line 146 is tied to a sample and hold capacitor 148.

In operation, assuming that the amplifier 132 has some offset voltage associated with a temperature coefficient and that the gain stability is essentially dependent on the values of the resistors, initially assume that the resistor 134 is tied through the switch 138*a* to ground, the resistor 136 is open circuited at the switch 138*b,* the sample and hold capacitor 142 is connected to the output of the amplifier 132 through the switch 138*c,* and the output of the amplifier is open circuited at the switch 138*d.* With the circuit connected as described, the output of the amplifier 132 will be given by the equation:

$$V_{outio} = -V_{io}\frac{R_{144}}{R_{134}} \qquad (1)$$

where $V{out}_{io}$ equals the output of the amplifier due to an input offset, $V_{io}$ equals the offset voltage of the amplifier, $R_{144}$ equals the resistance of the resistor 144, and $R_{134}$ equals the resistance of the resistor 134.

With the switch 138*c* in the position shown, the output of the amplifier 132, $V{out}_{io}$, is applied to the sample and hold capacitor 142 and this capacitor is charged to the output of the amplifier. The circuit is now stabilized and in condition to amplify an input signal with compensation for the initial offset. To place the circuit in a configuration to amplify an input signal, the switch 138*a* is changed to the second position to connect the resistor 134 to an input line. The switch 138*b* also changes to the second position, thereby connecting the capacitor 142 to the resistor 136. The switch 138*c* open circuits the output of the amplifier 132 from the capacitor 142 and the switch 138*d* connects the output of the amplifier to the capacitor 148. With the switches arranged as thus described, the output of the amplifier will be given by the equation:

$$V_{outin} = -V_{in}\frac{R_{144}}{R_{134}} + V_{outio}\frac{R_{144}}{R_{136}} \qquad (2)$$

where $V{out}_{in}$ equals the output of the amplifier 132, $V_{in}$ equals the input signal applied to the resistor 134, and $R_{136}$ equals the resistance of the resistor 136.

The voltage previously stored on the capacitor 142, that is, $V{out}_{io}$, is subtracted from the input signal at the junction of the resistors 134 and 136 (the inverting amplifier provides a negative $V{out}_{io}$) which is the second term of equation (2). This subtracts from the input signal and corrects for the offset voltage of the amplifier such that the output signal now equals only the amplified input signal.

To provide a continuous output from the circuit of FIG. 3, the output of amplifier 132 is applied to the sample and hold capacitor 148 when the switch 138*d* is in the second position. Thus, the voltage on the capacitor 148 equals the output of the amplifier 132 when an input signal is applied to the resistor 134. When the various switches are again changed to the first position, the output of the circuit on line 146 is equal to the last output of the amplifier 132 as stored on the capacitor 148. This provides a continuous uninterrupted output on the line 146.

The frequency with which the amplifier is switched from a stabilizing configuration to an amplification configuration depends on the frequency response desired. For a fairly slow changing input signal, the frequency with which the switches 138 are changed may be at a relatively slow repetition rate. Typically, the circuit is switched from a stabilizing configuration to an amplification configuration at a rate of about 100 cycles per second; although faster frequencies may be required for rapidly changing input signals. The higher the repetition rate of the switching, the more accurately the output on the line 146 represents an amplification of the input applied to the resistor 134.

Figure 5:
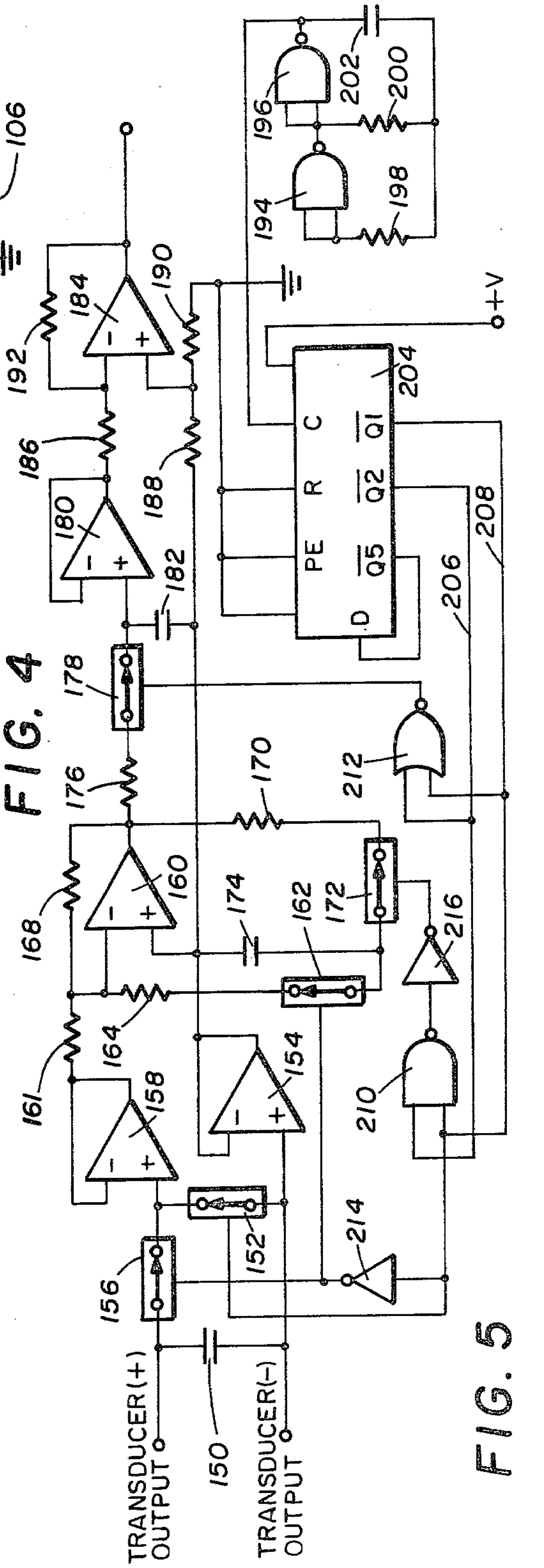
FIG. 5 is a schematic of one embodiment of a stabilized DC amplifier.

Referring to FIG. 5, there is shown an embodiment of the stabilized DC coupled amplifier for use in the pressure responsive system of FIG. 1 where the output terminal 32 is connected to one side of a capacitor 150 and the output terminal 34 is connected to the other terminal of the capacitor. The function of the capacitor 150 is to provide proper impedance coupling between the transducer 10 and the input of the DC coupled amplifier of FIG. 5. Also coupled to the output terminal 32 is one side of an electronic switch 152 and the non-inverting input terminal of an amplifier 154. Connected to the output terminal 34 is one side of an electronic switch 156. A second terminal of the electronic switches 152 and 156 are interconnected to the non-inverting terminal of an amplifier 158. The amplifiers 154 and 158 are connected as voltage followers again for impedance coupling. As voltage followers, the output terminal of each of the amplifiers 154 and 158 is directly coupled to the inverting input terminal.

Also connected to the output of the amplifier 154 is the non-inverting terminal of an amplifier 160. This voltage at the output of the amplifier 154 is the floating reference for the circuitry of FIG. 5. Connected to the output of the amplifier 158 is an input resistor 161 that is tied to the inverting terminal of the amplifier 160. Also connected to the inverting terminal of the amplifier 160 is an electronic switch 162 in series with a resistor 164. This electronic switch corresponds to switch 138*b* of FIG. 4. As a feedback for the amplifier 160, a resistor 168 interconnects from the output to the inverting input terminal.

Tied to the output of the amplifier 160 is a resistor 170 connected to an electronic switch 172 that corresponds with the switch 138*c* of FIG. 3. A common connection between the electronic switches 162 and 172 is tied to a capacitor 174 that corresponds with the capacitor 142 of FIG. 3. Capacitor 174 is connected to the reference output of the amplifier 154.

Also tied to the output of the amplifier 160 is a resistor 176 connected in series with an electronic switch 178 that corresponds with switch 138*d* of FIG. 4. Connected to the second terminal of switch 178 is an amplifier 180 and a capacitor 182. The capacitor 182 is the sample and hold capacitor 148 of FIG. 3.

The interconnection of the electronic switch 178 and the capacitor 182 is the output of the circuit of FIG. 3 which, in the embodiment of FIG. 5, is followed by a voltage follower consisting of the amplifier 180 and an amplifier 184. A resistor 186 interconnects the amplifiers 180 and 184. The second input of the amplifier 184 is connected to resistors 188 and 190 as part of a voltage divider connected from the output of the amplifier 154 to ground. A feedback loop for the amplifier 184 includes a resistor 192.

A voltage developed at the output of the amplifier 184 varies with the output of the transducer 10 with a correction for zero signal offset. Because the output of the amplifiers 180 and 184 are at a high enough level, the offset is no longer a significant term.

To sequence the operation of the electronic switches, the amplifier of FIG. 5 includes a timing network consisting of NAND gates 194 and 196, resistors 198 and 200, and a capacitor 202. Clock pulses from the NAND gate 196 are interconnected to a counter 204 generating time synchronizing pulses on lines 206 and 208. The time phasing pulses on line 206 are applied to a NAND gate 210 and a NOR gate 212. Timing pulses on the line 208 are also applied to the NAND gate 210 and the NOR gate 212, and in addition drives the electronic switch 152 and is input to an inverter 214. The output of the inverter 214 drives the electronic switch 156 and also the switch 162. Connected to the output of the NAND gate 210 is an inverter 216 that drives the electronic switch 172. The NOR gate 212 controls the operation of the electronic switch 178. The switching and operation of the circuit of FIG. 5 achieves the same result as the circuit of FIG. 3 to correct for an offset voltage of the amplifier.

A signal at the output of the amplifier 184 varies with absolute pressure with reference to signal ground. This signal is applied to the function generator 12 which converts the absolute pressure signal from the amplifier 184 into a signal varying with pressure altitude. The function generator of the system of the present invention is described in U.S. Pat. No. 4,094,480 for an Aircraft Altitude Hold System, issued on June 13, 1978. Specifically, the function generator may be of the type described with reference to FIG. 4 of U.S. Pat. No. 4,094,480.

While only one embodiment of the invention, together with modifications thereof, has been described in detail herein and showing in the accompanying drawings, it will be evident that various further modifications are possible without departing from the scope of the invention.

I claim:

1. A stabilized DC amplifier circuit, comprising:
an amplifier,
mixing means including first and second resistors connected to the input of said amplifier,
sample and hold means, and
switching means having a first position for connecting: (1) said first resistor to a reference source, and (2) the output of said amplifier to said sample and hold means; and having a second position for connecting: (1) said first resistor to the input signal, (2) said sample and hold means to the second resistor, and (3) disconnecting said sample and hold means from the output of said amplifier.

2. A stablized DC amplifier circuit, comprising:
an amplifier
mixing means connected to an input of said amplifier,
first sample and hold means,
second sample and hold means, and
switching means having a first position for connecting: (1) said mixing means to a reference source, (2) the output of said amplifier to said first sample and hold means, and (3) disconnecting the output of the amplifier from said second sample and hold means; and having a second position for connecting: (1) said mixing means to an input signal, (2) said first sample and hold means to said mixing means, (3) the output of said amplifier to said second sample and hold means, and (4) disconnecting said first sample and hold means from the output of said amplifier.

3. A stabilized DC amplifier circuit as set forth in claim 2 including means for controlling the operating sequence of said switching means between the first and second positions thereof.

4. A stabilized DC amplifier circuit, comprising:
an amplifier,
mixing means connected to an input of said amplifier,
first sample and hold means,
second sample and hold means, and
switching means including a first electronic switch having a first position for connecting said mixing means to a reference source and a second position for connecting said mixing means to an input signal, a second electronic switch having a first position for connecting the output of said amplifier to said first sample and hold means and a second position for disconnecting said first sample and hold means from the output of said amplifier, a third electronic switch having a first position for disconnecting said mixing means from said first sample and hold means and a second position for connecting said mixing means to said first sample and hold means, and a fourth electronic switch having a first position for disconnecting the output of said amplifier from said second sample and hold means and a second position for connecting the output of said amplifier to said second sample and hold means.

5. A stabilized DC amplifier circuit as set forth in claim 4 wherein said switching means includes means for time phasing the operation of said electronic switches between the first and second positions thereof.

6. A stabilized DC amplifier circuit as set forth in claim 4 wherein said switching means includes means for time phasing the operation of each of said electronic switches between the first to second positions thereof.

7. A stabilized DC amplifier circuit as set forth in claim 6 wherein said mixing means includes first and second resistors connected to the input of said amplifier, the first resistor alternately connected by the first electronic switch to the reference source in the first position and to an input signal in the second position, the second resistor connected by said third electronic switch when in the second position to said first sample and hold means.

8. A stabilized DC amplifier circuit as set forth in claim 7 wherein said first sample and hold means includes a capacitor for storing the output of said amplifier when the second electronic switch is in the first position thereof, and said second sample and hold means includes a capacitor for storing the output of said amplifier when the fourth electronic switch is in the second position thereof.

9. A stabilized DC amplifier circuit as set forth in claim 8 wherein said means for time phasing includes a clock generating timing pulses to logic for generating control pulses to each of said electronic switches.

* * * * *